US006345997B1

(12) United States Patent
Shon

(10) Patent No.: US 6,345,997 B1
(45) Date of Patent: Feb. 12, 2002

(54) CRT RECEIVING SOCKET HAVING INSULATION RIB AND MONITOR HAVING THE SAME

(75) Inventor: Young-Ki Shon, Suwon (KR)

(73) Assignee: SamSung Electronics Co., Ltd., Suwon City (KR)

(*) Notice: Subject to any disclaimer, the term of this patent is extended or adjusted under 35 U.S.C. 154(b) by 0 days.

(21) Appl. No.: 09/671,348

(22) Filed: Sep. 27, 2000

(30) Foreign Application Priority Data

May 23, 2000 (KR) ............................................ 12-27803

(51) Int. Cl.[7] .............................................. H01R 13/53
(52) U.S. Cl. ........................ 439/181; 439/182; 439/683
(58) Field of Search ................................ 439/181, 182, 439/683, 682, 567; 313/318.05, 318.06; 361/815, 817, 682

(56) References Cited

U.S. PATENT DOCUMENTS

| 4,064,412 A | * | 12/1977 | Johnson ...................... 313/318 |
| 4,075,531 A | * | 2/1978 | Marino ........................ 313/325 |
| 4,126,371 A | * | 11/1978 | Puhak ......................... 439/182 |
| 4,253,717 A | * | 3/1981 | Stewart ....................... 439/182 |
| 4,400,645 A | * | 8/1983 | Simovits, Jr. et al. ...... 313/325 |
| 4,873,578 A | * | 10/1989 | Tognoni et al. ............. 358/254 |
| 5,462,451 A | * | 10/1995 | Yeh .............................. 439/493 |
| 5,745,348 A | * | 4/1998 | Cha ............................. 361/815 |

* cited by examiner

Primary Examiner—P. Austin Bradley
Assistant Examiner—Ross Gushi
(74) Attorney, Agent, or Firm—Robert E. Bushnell, Esq.

(57) ABSTRACT

A cathode ray tube (CRT) receiving socket includes a body having a plurality of connection holes for receiving the pins of a CRT, a plurality of conductive pins protruding from the body in a certain direction for connection to a printed circuit board (PCB), and an insulation rib formed between a pin to which a high voltage is applied and a neighboring pin. The insulation rib protrudes from one side of the body in the same direction as that of the pins, and is integral with the body in the CRT receiving socket, into which a plurality of pins extending from one end of the CRT is inserted.

15 Claims, 10 Drawing Sheets

CRT RECEIVING SOCKET HAVING INSULATION RIB AND MONITOR HAVING THE SAME

CLAIM OF PRIORITY

This application makes reference to, incorporates the same herein, and claims all benefits accruing under 35 U.S.C. §119 from my application CRT RECEIVING SOCKET WITH INSULATING RIB AND MONITOR COMPRISING THE SAME filed with the Korean Industrial Property Office on May 23, 2000 and there duly assigned Ser. No. 27803/2000

BACKGROUND OF THE INVENTION

1. Technical Field

The present invention relates to a cathode ray tube (CRT) receiving socket for a monitor and, in particular, to a CRT receiving socket fixed at a video printed circuit board (PCB) for transferring an electrical signal to the CRT.

2. Related Art

Generally, the monitor is an apparatus capable of outputting electric beams from an electric gun of a CRT based on a video signal, and emitting light as the emitted electric beams are outputted onto a fluorescent material coated on a front surface of the CRT to thereby display a certain character, symbol and graphic.

Contemporary monitors are typically provided with a CRT receiving socket having pins which are subjected to high voltage, and this results in signal distortion. Moreover, such monitors employ an arrangement for preventing high voltage from being transferred from certain pins to other pins. This arrangement includes through grooves and insertion holes, but these grooves and holes are susceptible to the collection of dust and other foreign matter, especially in view of the high voltages involved. Thus, the insulation effect normally provided deteriorates. As a result, the diplay of the monitor can become unclear.

Therefore, there is a need for a CRT receiving socket which is not burdened by the aforementioned disadvantages.

SUMMARY OF THE INVENTION

Accordingly, it is an object of the present invention to provide a CRT receiving socket having an insulation rib and a monitor having the same which overcome the problems encountered in prior systems.

It is another object of the present invention to provide a CRT receiving socket having an insulation rib and a monitor having the same which are capable of enhancing the insulation between a PCB, to which a high voltage is applied, and the parts mounted on the PCB.

It is another object of the present invention to provide a CRT receiving socket having an insulation rib and a monitor having the same which are capable of preventing the problem of an unclear display by increasing the voltage applied to the G2 pin of the CRT.

It is another object of the present invention to provide a CRT receiving socket having an insulation rib and a monitor having the same which are capable of integrally forming a member capable of enhancing an insulation effect of a video PCB with a body.

To achieve the above objects, there is provided a CRT receiving socket into which a plurality of pins protruding from one end of a CRT are inserted, the socket comprising a body having a plurality of connection holes for receiving the pins of the CRT, a plurality of conductive pins protruding from the body in a certain direction for connection to the PCB, and an insulation rib formed between a pin to which a high voltage is applied and a neighboring pin among the plurality of the pins, and protruding from one side of the body in the same direction as that of the pins, and being integral with the body.

The shape of the insulation rib may be varied. For example, the insulation rib may have the same height as that of the conductive pin, and may have a height which is half that of the conductive pin. In this case, the height of the insulation pin is properly determined in such a manner that a foreign substance is not gathered in a through groove or hole, thereby decreasing an insulation effect. In addition, each insulation rib may have an arc shape, and may be provided between a pin, to which a high voltage is applied, and a neighboring pin.

Preferably, the pin to which a high voltage is applied is connected with the G2 pin of the CRT. Among the pins of the CRT, the pin to which a high voltage is applied is a G2 pin. About 600 to 800 volts is applied thereto. An insulation rib is formed at a portion around the pin of the CRT receiving socket connected with the G2 pin.

A through groove or hole having the same cross section as the insulation rib is formed on the PCB connected with the CRT receiving socket. When the CRT receiving socket is assembled to the PCB, it is possible to prevent foreign substances from gathering in the through groove or hole, thereby decreasing an insulation effect.

To achieve the above objects, there is provided a monitor having a CRT, a casing surrounding the CRT, and a PCB connected to a rear portion of the CRT. In the monitor according to the present invention, the CRT is inserted into the CRT receiving socket on the PCB, a plurality of pins protrude from one surface of the CRT receiving socket for electrical connection with the PCB, an insulation rib protrudes in the same direction as the pin, and at a portion of the pin among the pins to which a high voltage is applied, and a through groove or hole having the same cross section as the insulation rib is formed on the PCB, whereby the insulation rib is inserted into the through groove or hole when the CRT receiving socket is assembled to the PCB.

The pin to which a high voltage is applied is connected to a G2 pin of the CRT.

The rib is integral with the body of the CRT receiving socket. In the present invention, the fabrication cost of the PCB and other parts of the monitor is not increased.

Additional advantages, objects and features of the invention will become more apparent from the description which follows.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE PREFERRED EMBODIMENTS

Figure 1:
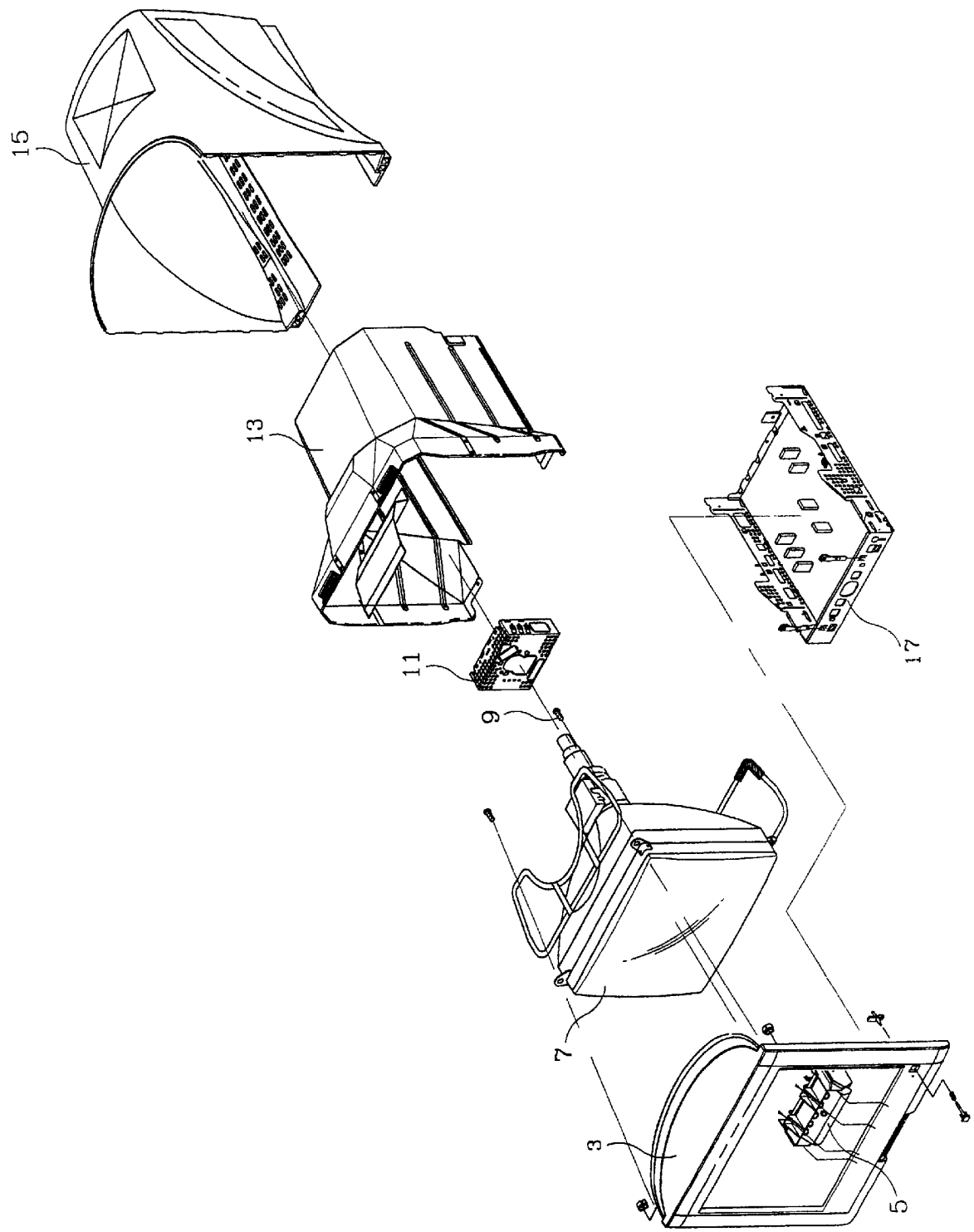
FIG. 1 is a view illustrating an exploded perspective view illustrating a monitor.

FIG. 1 is a view illustrating the construction of a monitor. As shown therein, the monitor includes a front casing 3 and a rear casing 15 which form an outer structure, a CRT 7 installed between the front casing 3 and the rear casing 15, a video PCB assembly 11 installed behind the CRT 7, an operation unit 5 installed below an inner portion of the front casing 15, a main PCB 17 connected with the operation unit 5 and the video PCB assembly 11, and an electric wave shield 13 installed between the rear casing 15 and the CRT 7. The CRT 7 is fixed at the front casing 3 by a certain member, such as a screw 9. The main PCB 11 externally receives and processes a video signal, and transfers the processed signal to the video PCB assembly 11, and the video PCB 11 transfers an analog signal to the CRT 7.

Figure 2:
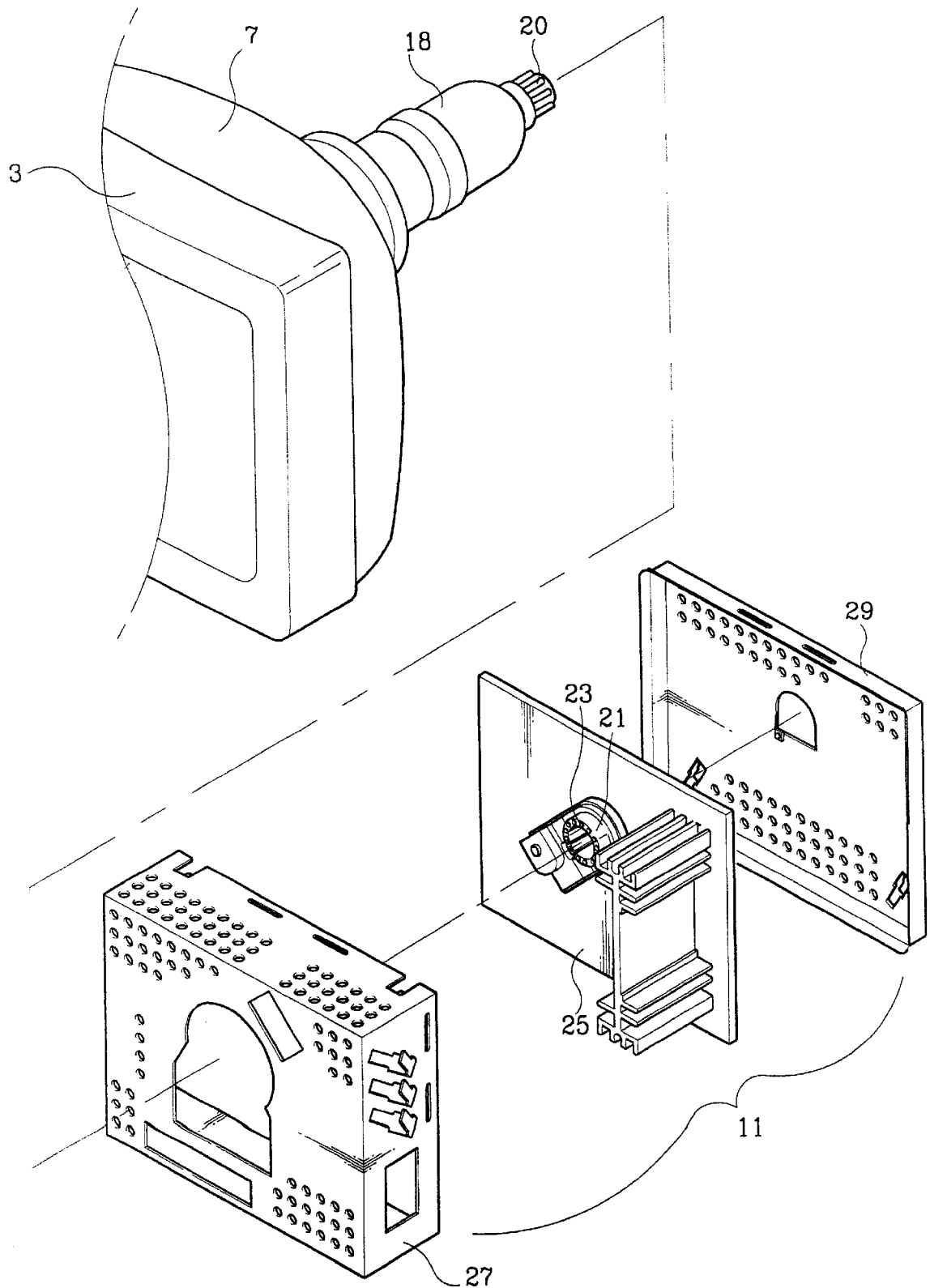
FIG. 2 is an exploded perspective view illustrating an engaged state of a CRT and a video PCB.

FIG. 2 is a view illustrating the video PCB assembly 11 and the CRT 7 of FIG. 1. The video PCB assembly 11 includes a video PCB 25, a front shield 27 which surrounds the front portions of the video PCB 25, and a rear shield 29 which surrounds the rear portions of the video PCB 25. The front shield 27 and the rear shield 29 prevent the electrical waves from being outputted from the video PCB 25. An electrical gun 18 is installed behind the CRT 7, and a plurality of pins 20 connected with the video PCB 25 protrude backwardly from the electric gun 18. The protruding pins 20 are inserted into connection holes 23 of a CRT receiving socket 21 installed on the video PCB 25. The video PCB 25 is connected with the main PCB 17 through a plurality of signal lines(not shown).

Figure 3:
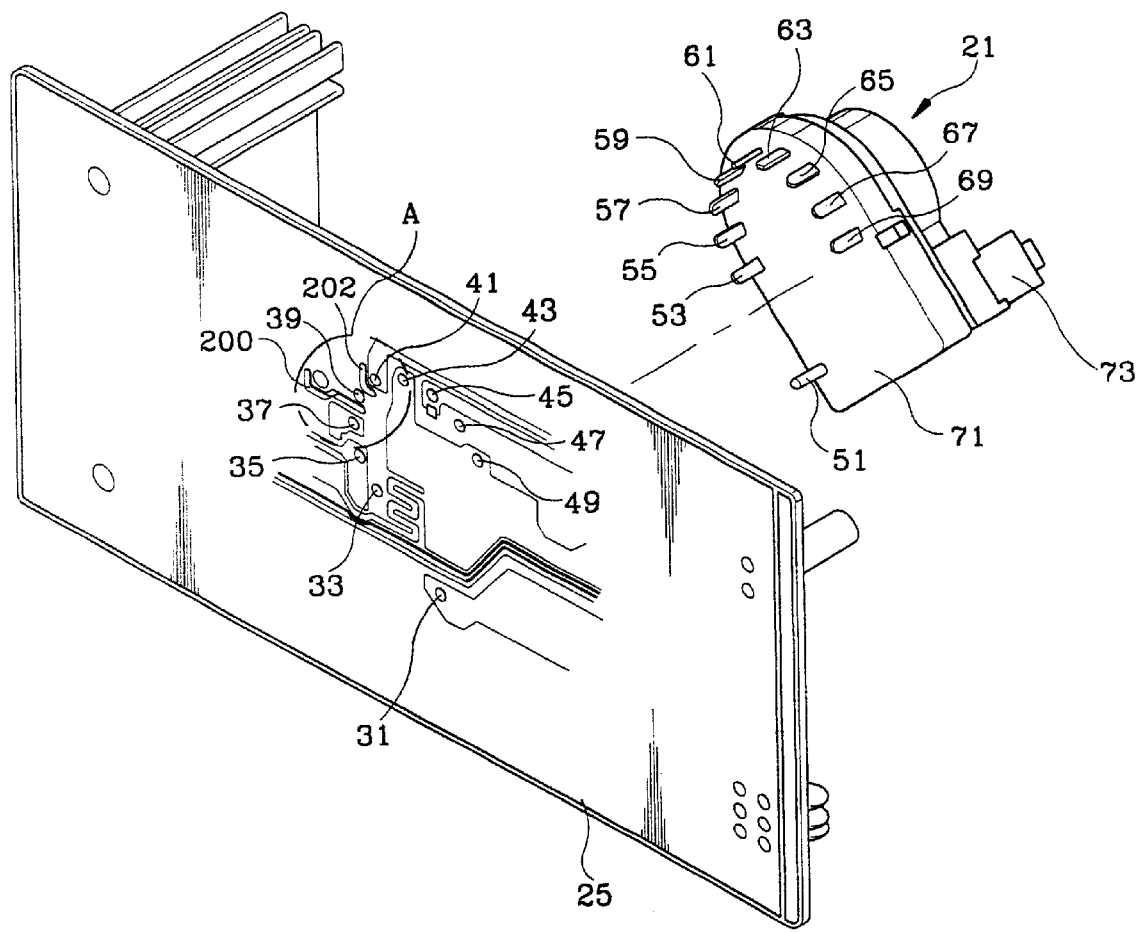
FIG. 3 is an exploded perspective view illustrating a state in which a CRT receiving socket is engaged to a video PCB.

FIG. 3 is a view illustrating a state wherein the CRT receiving socket 21 of FIG. 2 is separated from the video PCB 25. A plurality of pins 51, 53, 55, . . . , 69 protrude from a rear portion 71 of the CRT receiving socket 21, and the pins 51, 53, 55, . . . , 69 are inserted into insertion holes 31, 33, . . . , 49 formed at the video PCB 25, and are fixed thereto by a welding method. The CRT receiving socket 21 is formed of a plastic material having good insulation. Among the pins of the CRT receiving socket 21, a high voltage of 600 to 800 volts is applied to the pin 59 connected with the G2 pin of the CRT 7. Therefore, the signals may be distorted at a portion around the pin 59 of the CRT receiving socket 21 due to a high voltage. Furthermore, the through grooves 200 and 202 are formed at a portion around the insertion hole 39 into which the pin 59 is inserted for preventing a high voltage of the pin 59 from being applied to the pins 57 and 61.

Figure 4:
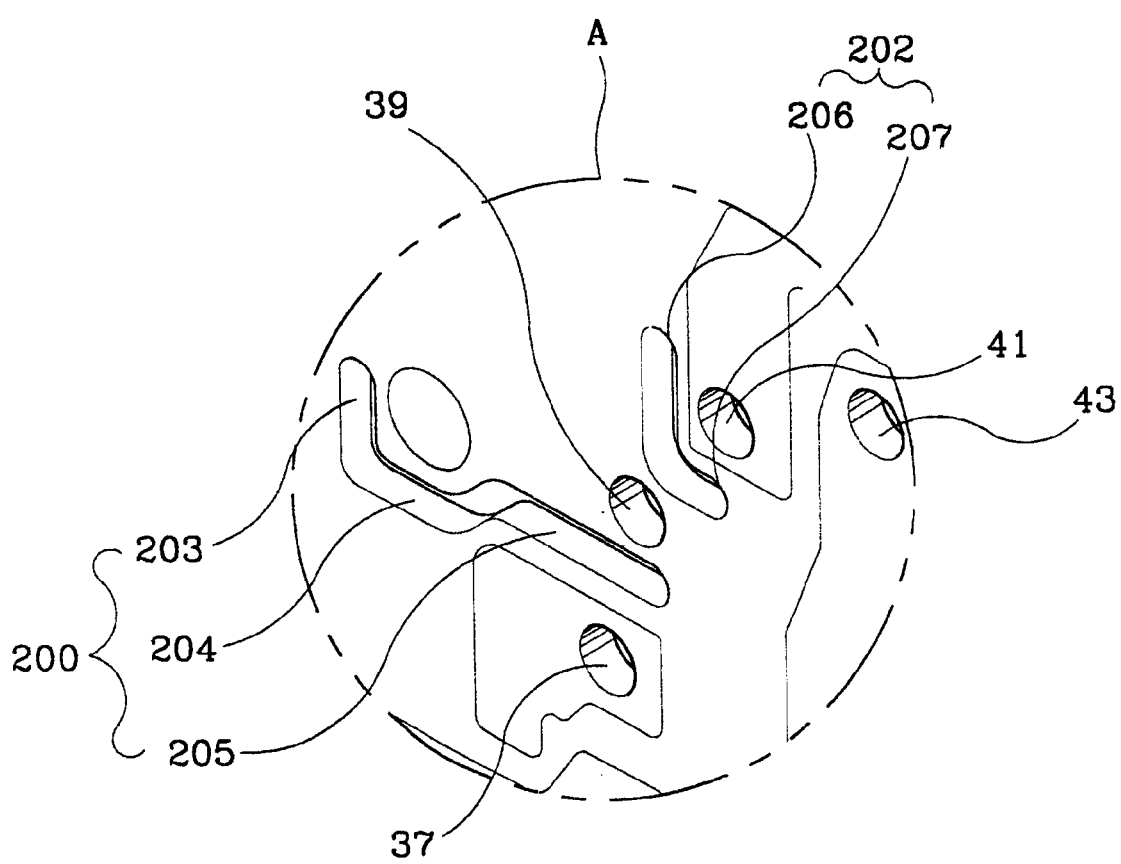
FIG. 4 is a perspective view illustrating an engaged state of a G2 pin of a CRT in the video PCB of FIG. 3.

FIG. 4 is a view illustrating the construction of the through grooves 200 and 202. As shown in FIG. 4, the first through groove 200 includes a vertical groove 203, a first horizontal groove 204 connected therewith, and a second horizontal groove 205 extending from the first horizontal groove 204. In addition, the second through groove 202 includes a vertical groove 206 and a horizontal through groove 207. The shapes of the through grooves 200 and 202 are such that the installations of the parts mounted on the PCB 25 and signals lines do not interfere with each other.

However, even when the through grooves 200 and 202 are formed on the PCB 25, foreign substances can become attached to the portions around the insertion hole 39. A part of the foreign substances may be moved into the through grooves 200 and 202. In particular, since a high voltage is applied to a portion around the G2 pin, a lot of dust can become attached thereto, and the through grooves 200 and 202 can become filled with the dust so that the insulation effect of the through grooves 200 and 202 is decreased. As a result, since a G2 voltage lower than the initial voltage is applied to the CRT 7, the display of the monitor becomes unclear. The above-described problem may cause a malfunction of the monitor.

Figure 5:
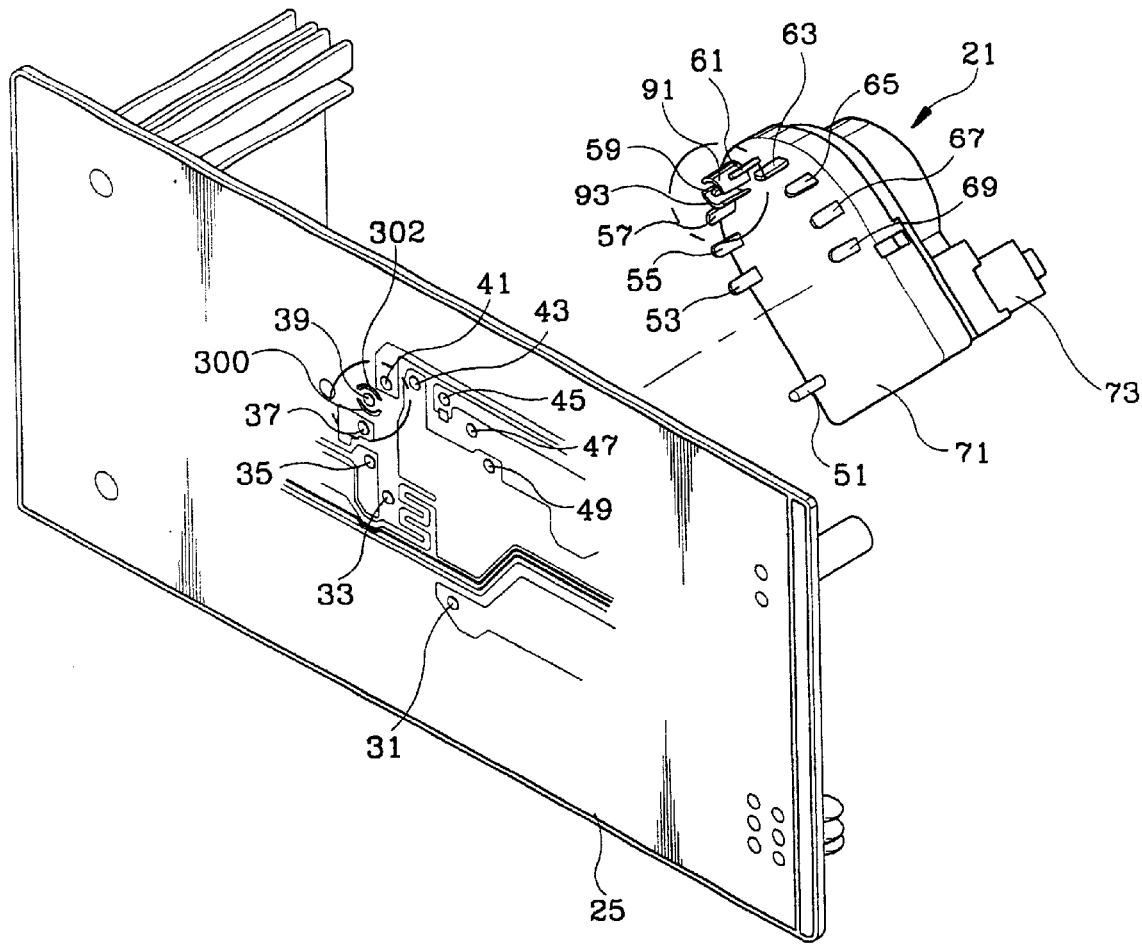
FIG. 5 is an exploded perspective view illustrating a state in which a CRT receiving socket is mounted on a video PCB according to a first embodiment of the present invention.

FIG. 5 is a view illustrating a first embodiment of a CRT receiving socket 21 corresponding to a video PCB 25 according to the present invention. As seen in FIG. 5, each of a pair of insulation ribs (protrusions) 91 and 93 has an arc-shaped cross section at a portion around the pin 59 connected to a G2 pin of the CRT, and each has the same height as that of the pin 59 and is formed between a pin 61 and a pin 57. The insulation ribs or protrusions 91 and 93 protrude perpendicularly from a surface 71 opposite to the video PCB 25.

Figure 6:
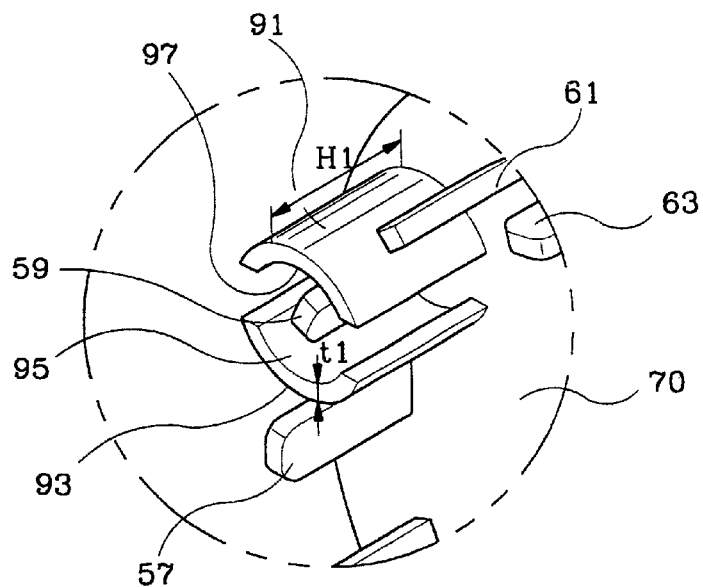
FIG. 6 is a partially enlarged view illustrating an engaged state of a G2 pin of a CRT in the CRT receiving socket of FIG. 5.

FIG. 6 is a partially enlarged view illustrating a pin 59 in the CRT receiving socket 21. Ribs 91 and 93, which surround the pin 59, protrude between the pins 59 and 61 and the pins 57 and 59, respectively. The heights H1 of the ribs or protrusions 91 and 93 are the same as that of the pin 59, and each of the ribs or the protrusions 91, 93 has a thickness of t1. The insulation ribs 91 and 93 are formed in such a manner that the pin 59 is placed at the inner portions 97 and 95 of the insulation ribs 91 and 93, respectively.

Figure 7:
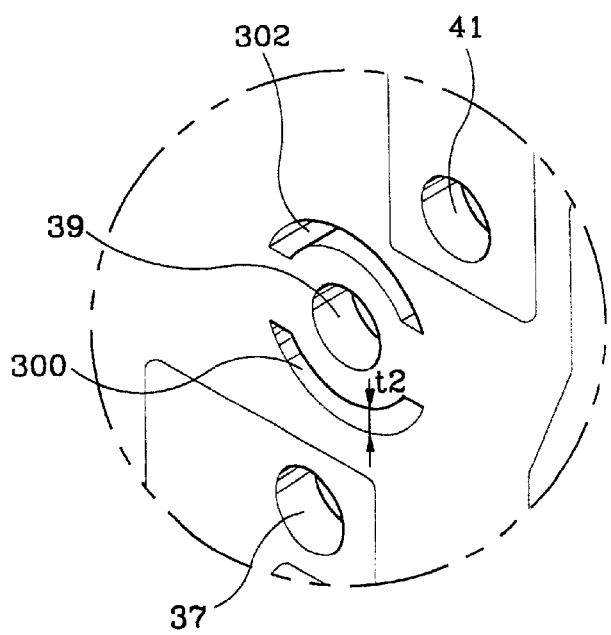
FIG. 7 is a partially enlarged view illustrating an engaged state of a G2 pin in the video PCB of FIG. 5.

FIG. 7 is a partially enlarged view illustrating a portion surrounding the insertion hole 39 into which the pin 59 of the CRT receiving socket 21 is inserted in the video PCB 25 of FIG. 5. An arc-shaped through groove 300 is formed between the insertion holes 37 and 39. A through hole 302 corresponding to the arc shape through groove 300 is formed between the insertion holes 39 and 41. The above through grooves each have a thickness of t2 in the radial direction. The thickness t2 may be the same as t1. For an easier assembly, t2 is slightly larger than t1.

Figure 8:
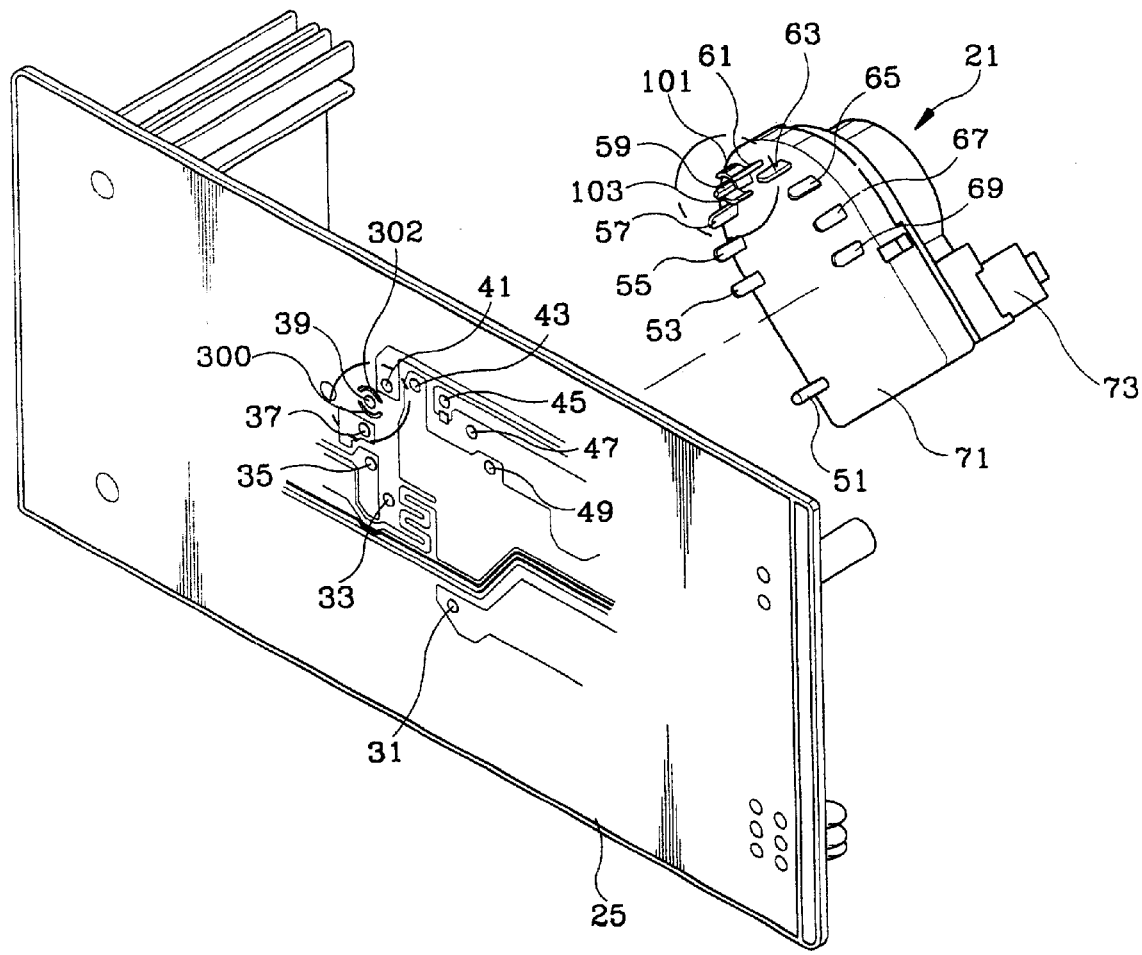
FIG. 8 is an exploded perspective view illustrating a state in which a CRT receiving socket is mounted on a video PCB according to a second embodiment of the present invention.
Figure 9:
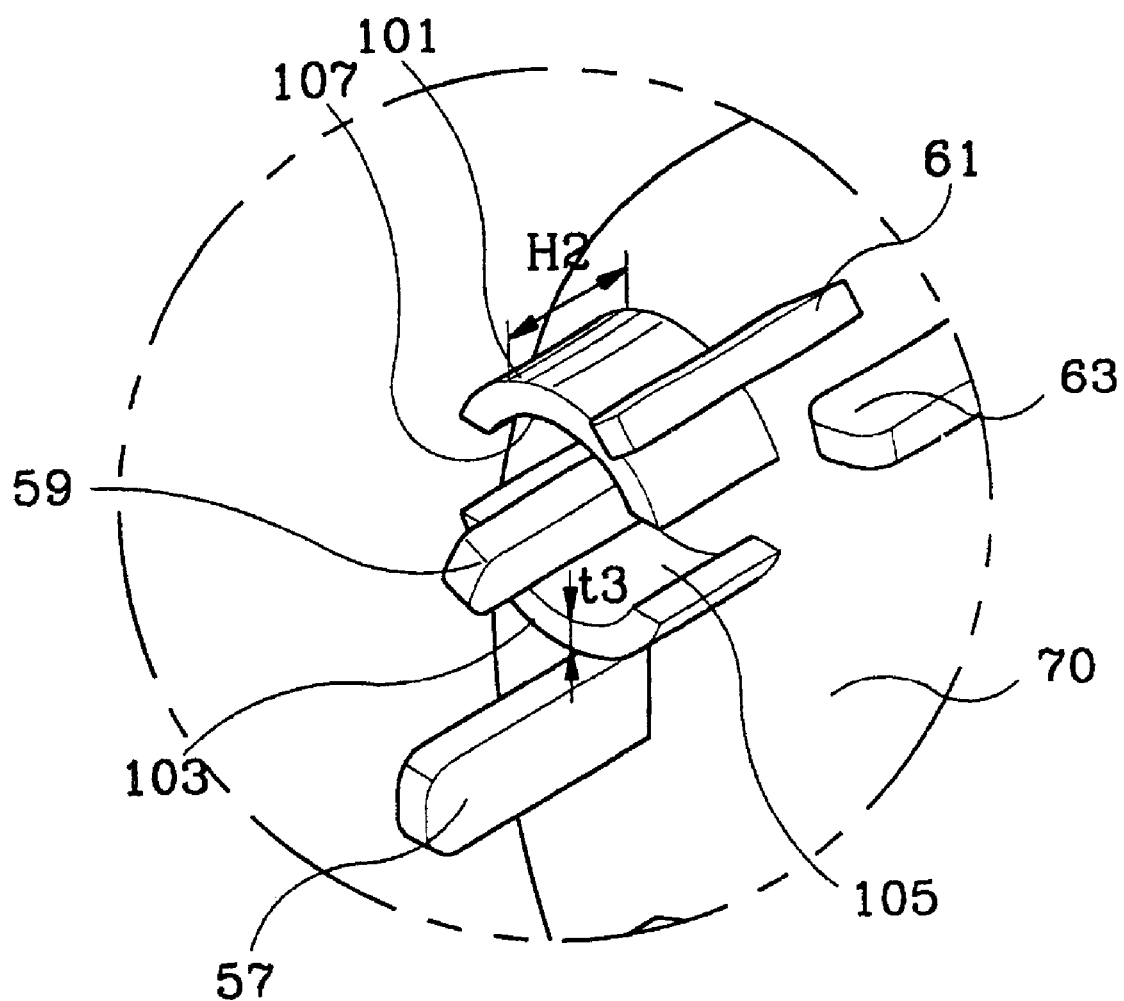
FIG. 9 is a partially enlarged view illustrating an engaged state of a G2 pin of a CRT in the CRT receiving socket of FIG. 8.

FIG. 8 is a view of a second embodiment of the video PCB 25 and the CRT receiving socket 21 according to the present invention. In the present invention, the heights of insulation ribs 101 and 103 protruding from a surface 71 of the CRT receiving socket 21 are lower than those in the first embodiment of the present invention. FIG. 9 illustrates the construction of the insulation ribs 101 and 103 of the second embodiment of the present invention. The height H2 of the protrusion is one half the height of the pin 59 and has a thickness t3. The insulation ribs 101 and 103 are formed in such a manner that the pin 29 is placed in the directions of the inner surfaces 105 and 107 of the insulation ribs 101 and 103. Therefore, it is possible to prevent any damage to the insulation ribs when assembling the system by decreasing the heights H2 of the insulation ribs 101 and 103. However, if the heights H2 of the insulation ribs 101 and 103 are small so that the through holes 300 and 302 are not properly filled, certain foreign substances, such as dust, may enter the through grooves 300 and 302. Therefore, an exaggerated decrease in the heights of the insulation ribs 101 and 103 is not needed.

Figure 10:
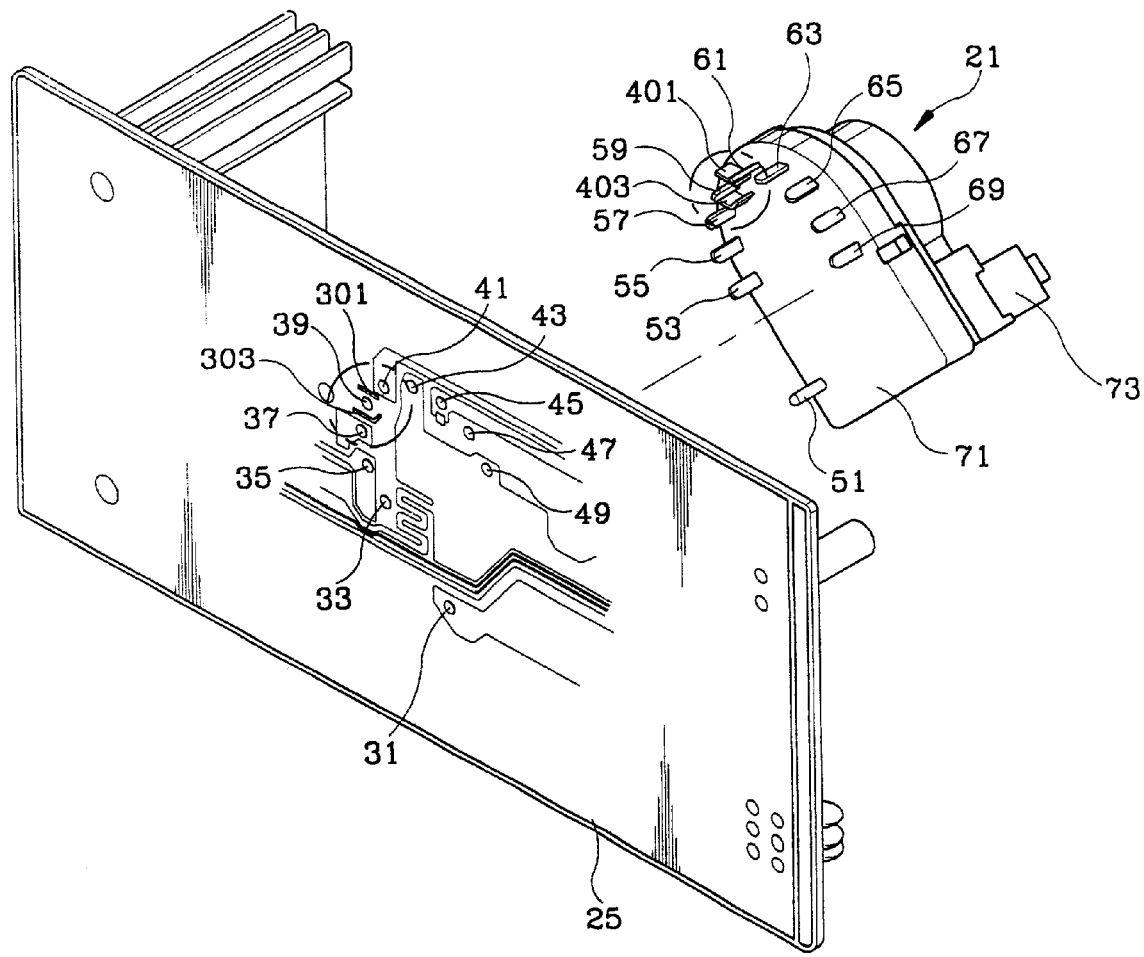
FIG. 10 is an exploded perspective view illustrating a state in which a CRT receiving socket is mounted on a video PCB according to a third embodiment of the present invention.
Figure 11:
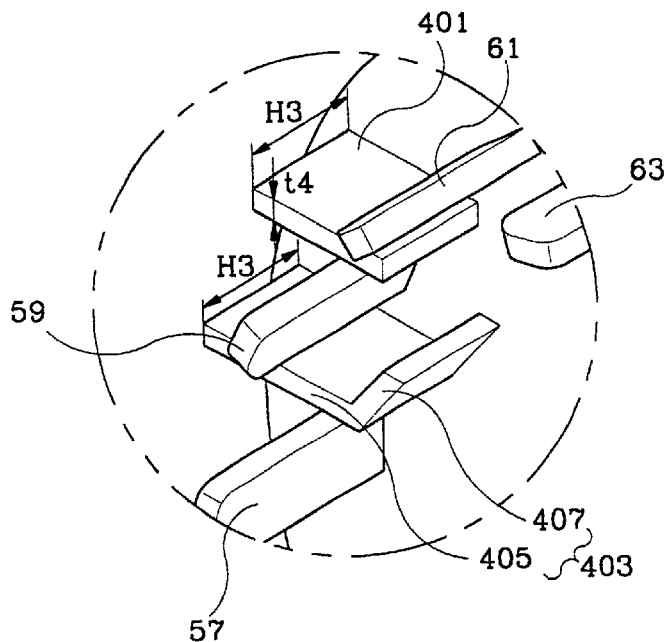
FIG. 11 is a partially enlarged view illustrating an engaged state of a G2 pin of a CRT in the CRT receiving socket of FIG. 10.

FIG. 10 is a view of a third embodiment of the video PCB 25 and the CRT receiving socket 21 according to the present invention. In the third embodiment of the present invention, the insulation ribs 401 and 403 each have a rectangular shaped cross-section compared to the first and second embodiments of the present invention, in which each of the insulation ribs 91, 101 and 93, 103 has an arc-shaped cross section. FIG. 11 is a partially enlarged view illustrating the portions of the pin 59 in the CRT receiving socket 21 according to the third embodiment of the present invention. As shown therein, an insulation rib 401 having a rectangular cross section, a certain thickness t4, and a height of H3 is formed between the pins 59 and 61 of the CRT receiving socket 21, and an insulation rib 403 formed of a rectangular portion 405 parallel to the insulation rib 401 and a rectangular portion 407 extending from the rectangular portion 405 at an angle of 60 degrees are formed between the pins 57 and 59.

Figure 12:
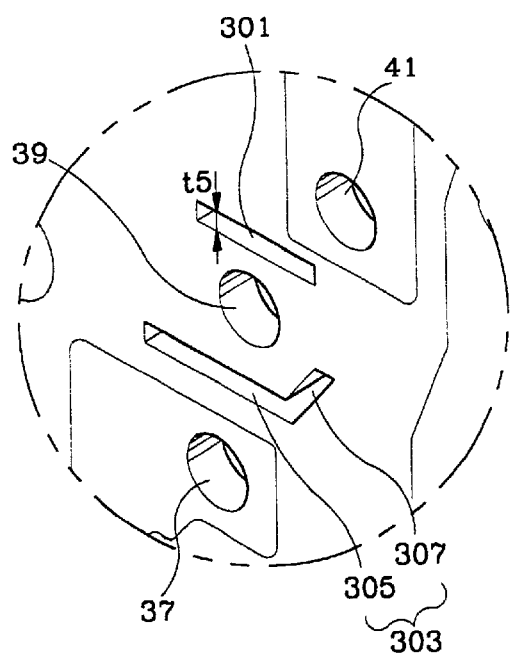
FIG. 12 is a partially enlarged view illustrating an engaged state of a G2 pin of the video PCB of FIG. 10.

FIG. 12 is a partially enlarged view of a video PCB 25 having through grooves or holes 301 and 303 corresponding to the insulation ribs 401 and 403. The through groove 301 of the video PCB 25, according to the third embodiment of the present invention, has a rectangular cross section having a thickness of t5. The through groove 303 formed between the insertion hole 39 and the insertion hole 37 is formed of a portion 305 parallel to the through groove 301, and a portion 307 which is upwardly extending from the portion 305. The thickness t5 is slightly larger than thickness t4 for an easier insertion of the insulation rib.

The front view of the construction in which the CRT receiving socket 21 is mounted on the video PCB 25 is the same as that of FIG. 2, which illustrates that the CRT receiving socket 21 is engaged. The CRT receiving socket 21 is fixedly mounted on the video PCB 25 by welding. The monitor according to the present invention includes a front casing 3 and a rear casing 15 which form an outer structure of the monitor, a CRT 7 installed therebetween, a video PCB assembly 11 installed behind the CRT 17, an operation unit 5 installed below the front casing 15, a main PCB 17 connected to the operation unit 5 and the video PCB assembly 11, and an electric wave shield 13 installed between the rear casing 15 and the CRT 17 in the same manner as in the monitor described previously.

In the present invention, it is assumed that a high voltage is applied to one pin. The insulation rib may be formed with respect to all pins, thereby enhancing an insulation effect. In addition, the shapes of the insulation rib and the through hole may be changed in such a manner that the shapes of the same do not interfere with the neighboring parts and the signal lines.

In the present invention, it is possible to prevent an unclear display of the screen and malfunction which occur in the prior monitors since, in the invention, foreign substances do not attach themselves to a portion of the G2 pin to which a high voltage is applied, as compared to prior monitors. In addition, the fabrication cost of the CRT receiving socket according to the present invention is not higher than that of the prior CRT receiving socket. It is possible to prevent a foreign substance, such as dust, from hampering the insulation of the PCB, and thereby decreasing the insulation effect.

Although the preferred embodiments of the present invention have been disclosed for illustrative purposes, those skilled in the art will appreciate that various modifications, additions and substitutions are possible without departing from the scope and spirit of the invention, as recited in the accompanying claims.

What is claimed is:

1. A cathode ray tube (CRT) receiving socket into which a plurality of pins extending from one end of a CRT are inserted, said CRT receiving socket comprising:

a body having a plurality of connection holes for receiving the pins of the CRT;

a plurality of conductive pins protruding from the body in a certain direction for connection with a printed circuit board (PCB); and an insulation rib formed between a conductive pin to which a high voltage is applied and a neighboring pin, said insulation rib protruding from one side of the body in a direction the same as a direction of the pin and the neighboring pin;

wherein said insulation rib has a height the same as a height of the conductive pin.

2. The socket of claim 1, wherein said insulation rib is formed integrally with the body.

3. The socket of claim 1, wherein said conductive pin is connected to a G2 pin of the CRT.

4. The socket of claim 1, wherein a through hole having a cross section the same as a cross section of the insulation rib is formed on the PCB.

5. The socket of claim 4, wherein said insulation rib has a rectangular cross section.

6. The socket of claim 1, wherein said insulation rib has a rectangular cross section.

7. A cathode ray tube (CRT) receiving socket into which a plurality of pins extending from one end of a CRT are inserted, said CRT receiving socket comprising:

a body having a plurality of connection holes for receiving the pins of the CRT;

a plurality of conductive pins protruding from the body in a certain direction for connection with a printed circuit board (PCB); and an insulation rib formed between a conductive pin to which a high voltage is applied and a neighboring pin, said insulation rib protruding from one side of the body in a direction the same as a direction of the pin and the neighboring pin;

wherein said insulation rib has an arc shaped cross section and is formed in a column shape, and said insulation rib is formed between the conductive pin and the neighboring pin.

8. The socket of claim 7, wherein a through hole having a cross section the same as a cross section of the insulation rib is formed on the PCB.

9. The socket of claim 7, wherein said insulation rib has a height the same as a height of the conductive pin.

10. In a monitor having a cathode ray tube (CRT), a casing surrounding the CRT and a printed circuit board (PCB) connected to a rear portion of the CRT, wherein said CRT is inserted into a CRT receiving socket on the PCB, a plurality of pins protrude from one surface of the CRT receiving socket for electrical connection with the PCB, an insulation rib protrudes in a direction corresponding to a direction of a pin to which a high voltage is applied, and a through hole having a cross section corresponding to a cross section of the insulation rib is formed on the PCB, whereby the insulation rib is inserted into the through hole when the CRT receiving socket is assembled to the PCB;

wherein said insulation rib has an arc shaped cross section, and said insulation rib is formed between said pin to which the high voltage is applied and a neighboring pin.

11. In the monitor of claim 10, wherein said pin to which the high voltage is applied is connected to a G2 pin of the CRT.

12. In the monitor of claim 10, wherein said insulation rib is integral with a body of the CRT receiving socket.

13. A monitor comprising a cathode ray tube (CRT), a printer circuit board (PCB), and connection means for connecting said CRT to said PCB, said connection means comprising:

a CRT receiving socket for receiving a portion of the CRT;

a plurality of pins protruding from a surface of said CRT receiving socket for connection with the PCB; and an insulation rib protruding from said CRT receiving socket and insertable into a portion of said PCB;

wherein said insulation rib has an arc shaped cross section, is formed in a column shape, and is formed between a pin to which a high voltage is applied and a neighboring pin.

14. The monitor of claim 13, wherein said pin to which the high voltage is applied to connected with a G2 pin of the CRT.

15. The monitor of claim 13, wherein a through hole is formed on the PCB and has a cross section which is the same as a cross section of the insulation rib.

* * * * *